US012699329B2

(12) United States Patent

Hippler et al.

(10) Patent No.: US 12,699,329 B2

(45) Date of Patent: Aug. 4, 2026

(54) LASER LITHOGRAPHY DEVICE AND METHOD FOR PRODUCING A THREE-DIMENSIONAL STRUCTURE

(71) Applicant: Nanoscribe Holding GmbH, Eggenstein-Leopoldshafen (DE)

(72) Inventors: Marc Hippler, Eggenstein-Leopoldshafen (DE); Michael Thiel, Karlsruhe (DE)

(73) Assignee: Nanoscribe Holding GmbH, Eggenstein-Leopoldshafen (DE)

( * ) Notice: Subject to any disclaimer, the term of this patent is extended or adjusted under 35 U.S.C. 154(b) by 211 days.

(21) Appl. No.: 18/431,935

(22) Filed: Feb. 3, 2024

(65) Prior Publication Data

US 2024/0288786 A1 Aug. 29, 2024

(30) Foreign Application Priority Data

Feb. 27, 2023 (DE) .................... 10 2023 104 751.5

(51) Int. Cl.
 *G03F 7/00* (2006.01)
(52) U.S. Cl.
 CPC ...... *G03F 7/70958* (2013.01); *G03F 7/70983* (2013.01)
(58) Field of Classification Search
 CPC ... B29C 64/106; B29C 64/209; B29C 64/268; B33Y 10/00; B33Y 30/00; B33Y 40/00; G02B 21/33; G02B 27/0006; G03F 7/0037; G03F 7/2053; G03F 7/70416; G03F 7/70958; G03F 7/70983; B23K 26/00; B23K 26/0006; B23K 26/046; B23K 26/0648; B23K 26/082; B23K 26/702

See application file for complete search history.

(56) References Cited

U.S. PATENT DOCUMENTS

| | | | |
|---|---|---|---|
| 2007/0285645 A1 | 12/2007 | Schwertner et al. | |
| 2008/0297745 A1 | 12/2008 | Weissenrieder et al. | |
| 2012/0218535 A1 | 8/2012 | Thiel et al. | |

(Continued)

FOREIGN PATENT DOCUMENTS

| | | |
|---|---|---|
| DE | 101 11 422 A1 | 9/2002 |
| DE | 10 2006 016 533 A1 | 11/2007 |

(Continued)

OTHER PUBLICATIONS

Andrea Toulouse et al.: High Resolution Femtosecond Direct Laser Writing with Wrapped Lens, Optical Materials Express, vol. 12, No. 9, Sep. 1, 2022, pp. 3801-3809.

*Primary Examiner* — Peter B Kim

(74) *Attorney, Agent, or Firm* — ASLAN LAW, P.C.

(57) ABSTRACT

A laser lithography device for producing a three-dimensional structure in a lithographic material comprising a laser source for emitting a laser writing beam and a lens for focusing the laser writing beam in a focus region. The lens has an optical terminating element. Furthermore, the laser lithography device comprises a scanning device for displacing the focus region of the laser writing beam relative to the lithographic material and a protection device for preventing contact between the optical terminating element and the lithographic material. The protection device is arranged on the optical terminating element.

14 Claims, 4 Drawing Sheets

(56)     References Cited

U.S. PATENT DOCUMENTS

Figure 1:
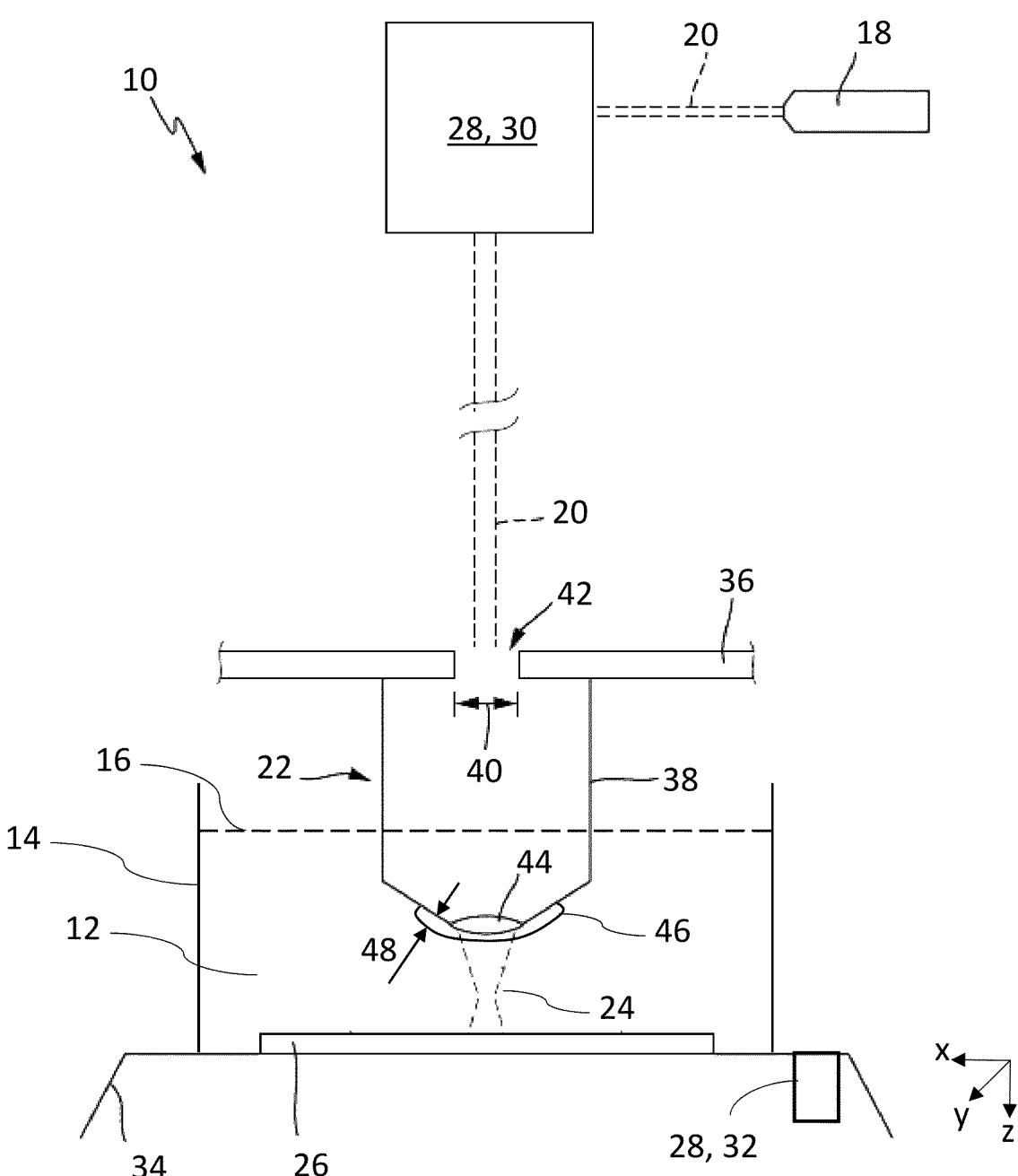

| | | | |
|---|---|---|---|
| 2013/0038849 A1* | 2/2013 | Weippert ............... | B82Y 20/00 |
| | | | 428/413 |
| 2016/0299426 A1 | 10/2016 | Gates et al. | |
| 2018/0231888 A1 | 8/2018 | Gates et al. | |
| 2020/0147865 A1 | 5/2020 | Hoffmann et al. | |
| 2022/0043354 A1 | 2/2022 | Lauermann et al. | |
| 2022/0350127 A1 | 11/2022 | Huffman et al. | |

FOREIGN PATENT DOCUMENTS

| | | |
|---|---|---|
| DE | 10 2011 012 484 A | 8/2012 |
| DE | 10 2018 128 418 B3 | 11/2019 |
| DE | 10 2018 221 670 A1 | 6/2020 |
| GB | 2 431 670 A | 5/2007 |
| JP | 2006-235208 A | 9/2006 |

* cited by examiner

LASER LITHOGRAPHY DEVICE AND METHOD FOR PRODUCING A THREE-DIMENSIONAL STRUCTURE

CROSS-REFERENCE TO RELATED APPLICATIONS

This application claims priority to DE Patent Application No. 10 2023 104 751.5 filed on Feb. 27, 2023, the entire contents of which are hereby incorporated by reference.

The invention relates to a laser lithography device and a method for producing a three-dimensional structure by means of a laser lithography device.

The technique referred to in the present context of laser lithography is also referred to, for example, as stereolithography or direct laser writing. With this technique, structures are written into a generally initially liquid photosensitive substance, which is referred to in the present context as lithographic material, by means of a laser writing beam. In the process, a solidification effect is locally triggered in the lithographic material by the laser writing beam. The solidification takes place, for example, due to a local polymerization of the lithographic material induced by photon absorption. In the field of optical lithography, such a lithographic material is also referred to as photoresist. In the field of stereolithography, this is also referred to as resin.

The technique of laser lithography or of direct laser writing is advantageously used in the production of micro- or nanostructures when high precision is desired and at the same time freedom of design and flexibility in shaping is to be maintained. In contrast to, for example, the method of mask lithography, different structures can namely be written without the structure being specified by a mask or the like.

Various techniques are known here which can, to a varying extent, lead to a direct contact between the focusing optics or its optical terminating element and the lithographic material. Firstly, in principle, it is known that the desired overall structure is produced by sequentially writing a series of partial structures (for example, in layers or slices) which then overall complement one another to form the desired structure.

In one type of known techniques, the writing beam strikes the surface of a volume of lithographic material and leads to local solidification on the surface. As a rule, these methods are based on linear processes such as one-photon absorption and the resulting local change of the lithographic material. To write three-dimensionally extended structures, in such methods, after writing a layer in an application step, an additional layer of lithographic material is applied. This can be achieved, for example, in that a substrate with the structure to be written thereon is gradually lowered into a bath of lithographic material, and the structuring takes place in each case by means of the writing beam on the surface. In such techniques, it can happen that the terminating element of the focusing optics comes into contact with lithographic material.

Another approach uses the physical principle of two-photon polymerization or multi-photon polymerization in general to achieve solidification of lithographic material even within a volume of lithographic material, i.e., also below the surface. This is made possible in that writing beam and lithographic material are coordinated with one another such that a solidification effect takes place with the involvement of non-linear effects. For example, the writing beam is selected in a spectral range which normally cannot trigger a solidification effect in the lithographic material. For example, the lithographic material and writing beam can be coordinated with one another such that an induced solidification could only take place by radiation that has a wavelength which corresponds to a fraction (in particular, an integer fraction) of the wavelength of the writing beam actually used. A solidification process is thereby possible only with simultaneous absorption of two or more photons of the writing beam (two-photon polymerization or multi-photon polymerization). In the present context, the term multi-photon polymerization denotes the induced polymerization by simultaneous absorption of two or more than two photons. In this respect, the term "multi-photon absorption" also includes the process of "two-photon absorption" and "two-stage absorption" for the present description. The conditions required for multi-photon polymerization are generally only achieved in a zone of increased intensity. This increased intensity zone is provided in a focus region of the laser writing beam. In this respect, the focus region is a beam waist of the laser writing beam which is produced by suitable optics (e.g., beam guiding optics, beam shaping optics and/or a lens). For lithographic production of extended 3D structures, the focus region can then be moved through a volume of lithographic material in accordance with geometry description data and trigger a solidification process locally.

The production of three-dimensional structures by means of two-photon polymerization is often carried out at a working distance of 100 µm to 20 mm. The working distance is a distance between the focus region and an optical terminating element of a lens for producing the focus region. At such low working distances, a contact of the lens with the lithographic material can often not be prevented. The lens frequently dips into the lithographic material. A production method in which the lens dips at least partially into the lithographic material can also be referred to as dip-in multi-photon polymerization. Therefore, during the production of three-dimensional structures, the lithographic material frequently gets on the lens and in particular on the optical terminating element.

DE 101 11 422 A1 shows 3D laser lithography using multi-photon polymerization within a bath of lithographic material in a container. The device described for this purpose has exit optics for focusing the laser beam onto a focus region within the container.

DE 10 2011 012 484 A1 discloses 3D laser lithography using multi-photon polymerization within a liquid lithographic material, wherein a lens of the laser optics dips into the lithographic material.

DE 10 2018 221 670 A1 describes a device for the optical processing of an object. The device comprises a lens for exposure of the object by means of a light beam, wherein a membrane is arranged between the lens and the object, which membrane is spaced apart from the lens. The membrane is movable in the direction of an optical axis of the light beam, wherein positioning elements enable the movement of the membrane.

It is the object of the invention to provide a laser lithography device and a method for producing a three-dimensional structure by means of the laser lithography device. In this case, the laser lithography device should preferably be compatible with a plurality of different lithographic materials.

This object is achieved by a laser lithography device having the features of claim 1 and by a method for producing a three-dimensional structure having the features of claim 10. Advantageous and preferred embodiments of the invention are contained in the additional claims.

A laser lithography device according to the invention for producing a three-dimensional structure in a lithographic material comprises a laser source for emitting or radiating a laser writing beam and a lens for focusing the laser writing beam in a focus region (often also referred to simply as focus). The lens has an optical terminating element. Furthermore, the laser lithography device comprises a scanning device for displacing the focus region of the laser writing beam relative to the lithographic material and a protection device for preventing contact between the optical terminating element and the lithographic material. The protection device is arranged on the optical terminating element.

By arranging the protection device on the optical terminating element, a direct contact between the optical terminating element and lithographic material can be prevented, in particular even if the lens dips into the lithographic material. In this way, for example, problems can be avoided if lithographic materials are used which contain dyes or components which damage the optical terminating element when they contact the optical terminating element. Furthermore, effort to clean the lens after producing the three-dimensional structure can advantageously be significantly reduced; in particular, a cleaning of the lens can be completely omitted if the protection device is replaced. Likewise, a propagation path of the laser writing beam within the lithographic material can advantageously be reduced by selecting a suitable thickness of the protection device, which is why it is ensured, when highly absorbing lithographic materials are used, that sufficient power of the laser writing beam reaches the focus region in order to induce polymerization of the lithographic material. Therefore, due to the protection device, the laser lithography device is compatible with a plurality of different lithographic materials.

In addition, arranging the protection device on the optical terminating element prevents impurities from the optical terminating element from being introduced into the lithographic material. A contamination of the lithographic material is thereby prevented, and the production of a sterile three-dimensional structure is enabled.

Furthermore, the protection device can advantageously act as a buffer to reduce damage in the event of a collision of the lens with samples within the lithographic material or an already produced three-dimensional structure.

The laser writing beam and the lithographic material can be coordinated with one another such that to produce the three-dimensional structure by means of multi-photon polymerization, the lithographic material can be solidified locally within the focus region.

The laser writing beam can be a continuous wave laser writing beam or a pulsed laser writing beam. In particular, a pulse of the pulsed laser writing beam can have a pulse duration of 50 femtoseconds to 500 nanoseconds.

The lens can, for example, have a numerical apparatus in the range from 0.01 up to and including 1.4.

The optical terminating element can have an optical element through which the laser writing beam exits the lens. The optical terminating element can comprise or form the optical element that limits the lens, in particular with respect to an environment of the lens. The optical terminating element can comprise or form a terminating lens, in particular a converging lens, or an end window, in particular a glass disk. The optical terminating element can also comprise further means, for example, an adhesive. The optical terminating element can, for example, be fastened in a lens housing of the lens by means of said adhesive.

The focus region of the laser writing beam relative to the lithographic material can be displaced by a deflection of the laser writing beam and/or by a displacement of the lithographic material. The scanning device can be designed to displace the lithographic material or a suitable carrier device (e. g., container, substrate, or the like) for the lithographic material. For this purpose, the scanning device can comprise actuators, in particular servomotors or linear motors, which displace the lithographic material. Additionally or alternatively, the scanning device can be designed to displace the focus region. For this purpose, the scanning device can have a beam guiding and steering assembly, for example, in the form of scanner mirrors and/or acousto-optical deflectors. The beam guiding and steering assembly can be arranged between the laser source and the lens or the optical terminating element.

The beam guiding and steering assembly can comprise a beam shaping module for adapting focus variables and/or for dynamic imaging of complex intensity patterns. The beam shaping module can be arranged between the laser source and the lens.

In principle, the protection device can be designed in one piece. The protection device can, in particular, be designed separately from the lens.

The protection device can be designed to prevent the contact between the optical terminating element and the lithographic material when the lens is immersed in the lithographic material. The protection device can be designed to be immersed partially and/or completely in the lithographic material.

The protection device can have a refractive index that differs from a refractive index of the lithographic material. However, the refractive index can preferably also be the same. The protection device can have a refractive index that differs from a refractive index of the optical terminating element. However, the refractive index can preferably also be the same. The protection device can have a refractive index that has a value which is between a value of the refractive index of the optical terminating element and a value of the refractive index of the lithographic material.

The protection device can have a thickness of 2 μm to 4 mm, in particular 2 μm to 500 μm, in particular 300 μm or 60 μm.

The protection device can be detachably arranged on the optical terminating element. Advantageously, the protection device can thereby be exchanged if deposits of the lithographic material are present on the protection device, for example.

The protection device can be arranged on the optical terminating element such that a cavity, for example an air chamber, is avoided between the optical terminating element and the protection device. The protection device can be arranged directly on the optical terminating element, in particular, can seal against it. In particular, the protection device can have touching contact with the optical terminating element. The protection device can cover the optical terminating element.

In a development of the laser lithography device, the protection device has a film or a foil. Advantageously, the film or the foil can be arranged relatively easily on the optical terminating element and is cost-effective. The film or foil can be arranged on the optical terminating element. The film or foil can be a homogeneous sheet of very thin plastic. The film or foil can have a thickness of 2 μm to 4 mm, in particular 2 μm to 500 μm, in particular 300 μm or 60 μm. The protection device can be, in particular only, a film or a foil. In particular, the protection device can preferably consist only of a film or a foil.

In a development of the laser lithography device, the protection device is designed to be fastened to the optical terminating element. The protection device can be designed to be fastened to the optical terminating element by means of loose molecular bonds, in particular Van der Waals bonds. The protection device can be an adhesive film which is designed to be fastened to the optical terminating element by means of adhesion. Additionally or alternatively, the protection device can comprise a holder for fastening the protection device to the lens. In particular, the holder can be an O-ring.

In a development of the laser lithography device, the protection device has an adhesive layer for fastening the protection device to the optical terminating element. Advantageously, the protection device can be fastened to the optical terminating element in a particularly simple and reliable manner by means of the adhesive layer. The adhesive layer can be arranged on the optical terminating element. The adhesive layer can have a thickness of 2 µm to 100 µm, in particular 2 µm to 50 µm, in particular 20 µm. The protection device can be, in particular only, a sticker, in particular an adhesive tape. The sticker can comprise the adhesive layer and the film or the foil. In particular, the protection device can preferably consist only of a sticker. Depending on the embodiment, it is conceivable that conventional adhesive tapes or adhesive films are used in a simple manner.

In a development of the laser lithography device, a transmittance of the protective device for the laser writing beam is at least 80%, in particular 85%, 90%, 92%, 95% or 98%. Advantageously, with high transmittance, it is ensured that sufficient power of the laser writing beam enters the focus region to induce polymerization of the lithographic material.

In a development of the laser lithography device, the lens has a lens housing. The optical terminating element is accommodated, in particular held, by the lens housing. The lens housing often has at least one element that is unsuitable for contact with the lithographic material. The protection device then preferably also covers said element to prevent contact between the element and the lithographic material. Advantageously, the lens can thereby dip particularly deep into the lithographic material.

The element can be described as unsuitable for contact with the lithographic material if, for example, in case of contact, the element is damaged or a high cleaning effort is required to remove the lithographic material from the element. A high cleaning effort can be understood to mean that cleaning by wiping with a clean cloth is not sufficient to remove the lithographic material from the element.

The element can comprise a recess of the lens housing, for example, in the form of a groove or a thread. In particular, the lens housing can comprise two housing parts, wherein the lens housing has a recess in the form of a groove at a connection point of both housing parts. Additionally or alternatively, the element can comprise an operating element for correcting imaging errors. The operating element can comprise a correction collar. Imaging errors can be chromatic aberration and/or spherical aberration.

In a development of the laser lithography device, the protection device has a refractive index that can be corrected by the lens. Imaging errors can be reduced by correcting the refractive index of the protection device. For example, the lens can be corrected for the refractive index of the protection device and, with a suitable choice of the thickness of the protection device, a propagation path of the laser writing beam within the lithographic material can be reduced such that the lithographic material can have a refractive index that cannot be corrected by the lens. It is thus also possible to use lithographic materials for producing the three-dimensional structure, the refractive index of which cannot be corrected by the lens.

In a development of the laser lithography device, the protection device has a first layer having a first refractive index and a second layer having a second refractive index. The first refractive index differs from the second refractive index. The first layer can be the adhesive layer. The refractive index of the protection device can advantageously be adapted by means of the first layer and the second layer. In particular, the refractive index of the protection device can be adapted such that it can be corrected by the lens. The first layer can be on the optical terminating element. The first layer can be arranged between the optical terminating element and the second layer. The refractive index of the protection device can be a combination of the first refractive index and the second refractive index.

In a development of the laser lithography device, the laser lithography device comprises a further protection device for preventing contact between the optical terminating element and the lithographic material. The further protection device is arranged on the first protection device described above. A propagation path of the laser writing beam within the lithographic material can advantageously be reduced by means of the protection device and the further protection device.

The further protection device can cover the protection device. The further protection device can be the same as the protection device. Alternatively, the further protection device can differ from the first protection device in the thickness or the refractive index. For example, the thickness of the (first) protection device can be 60 µm, and the thickness of the further protection device can be 100 µm.

A method according to the invention for producing a three-dimensional structure in a lithographic material is carried out by means of a laser lithography device described above.

Figure 2:
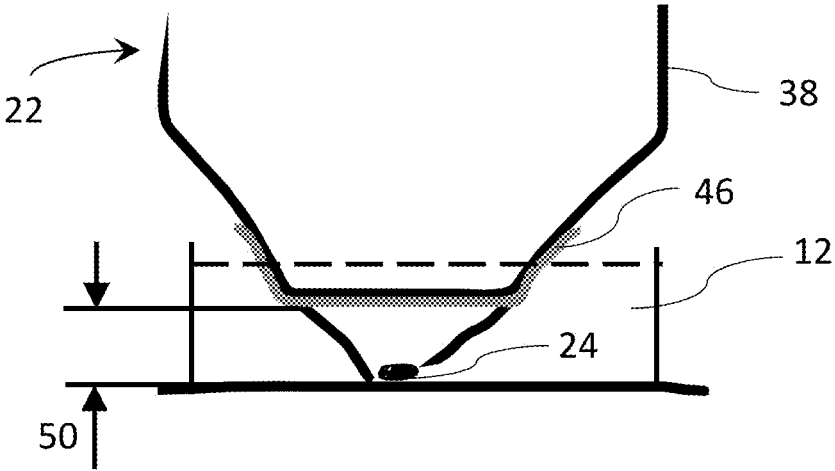
Figure 3:
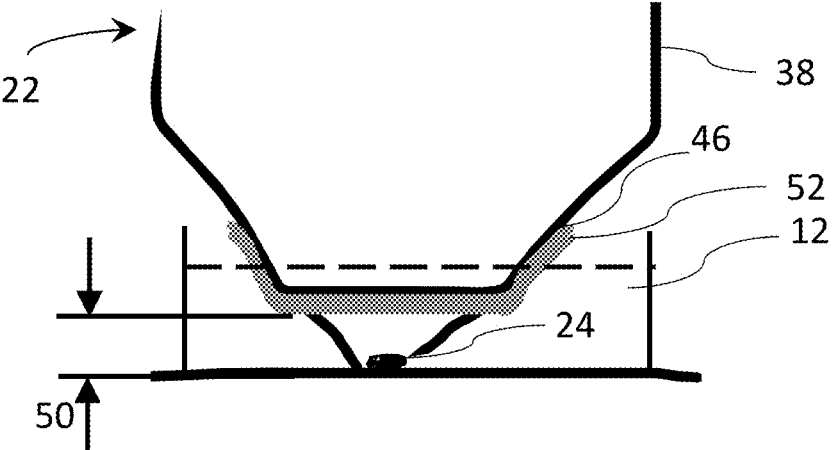
Figure 4:
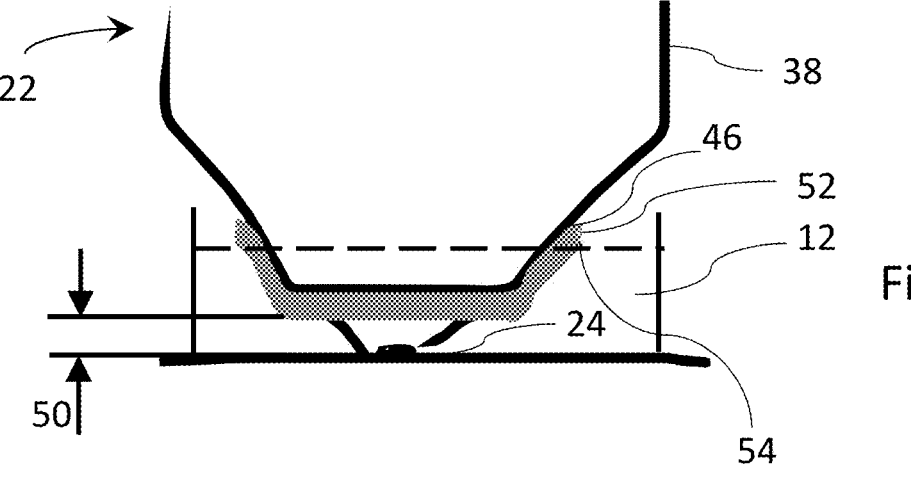
Figure 5:
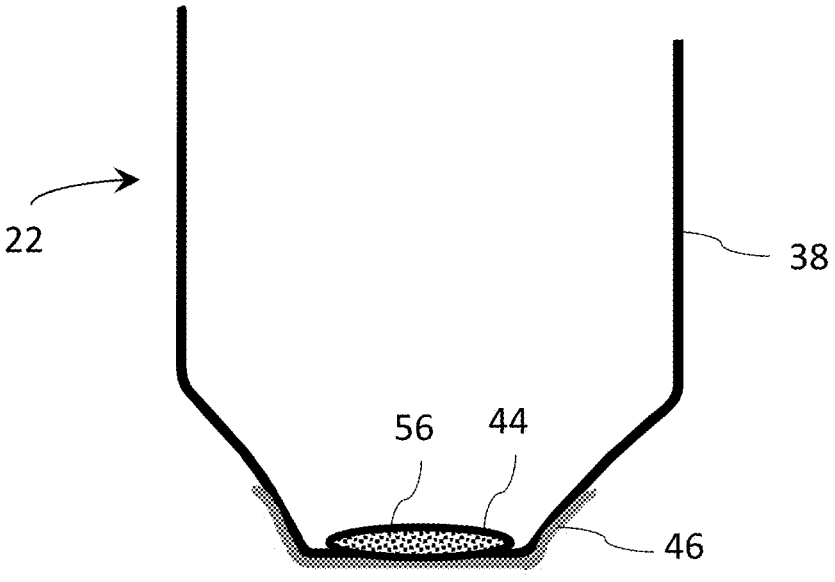
Figure 6:
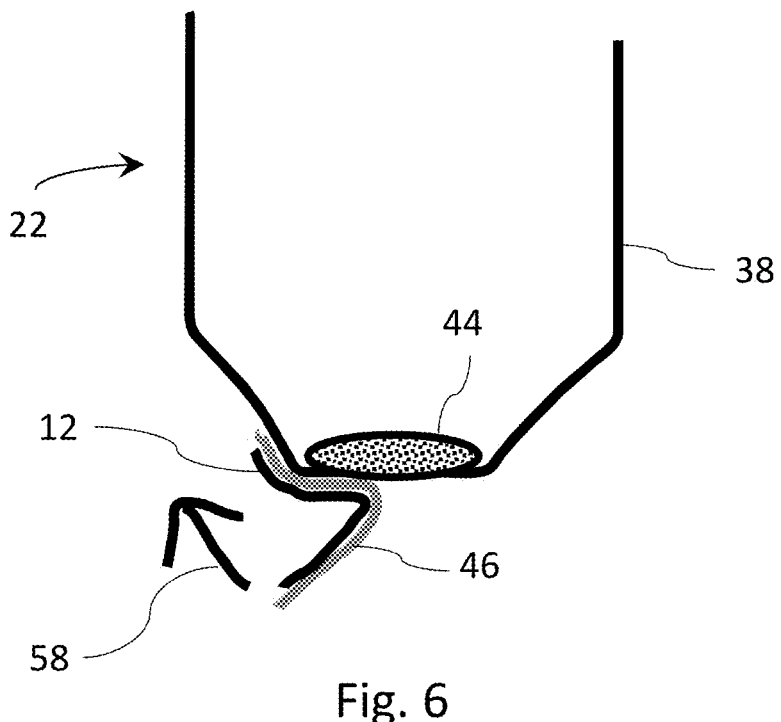
Figure 7:
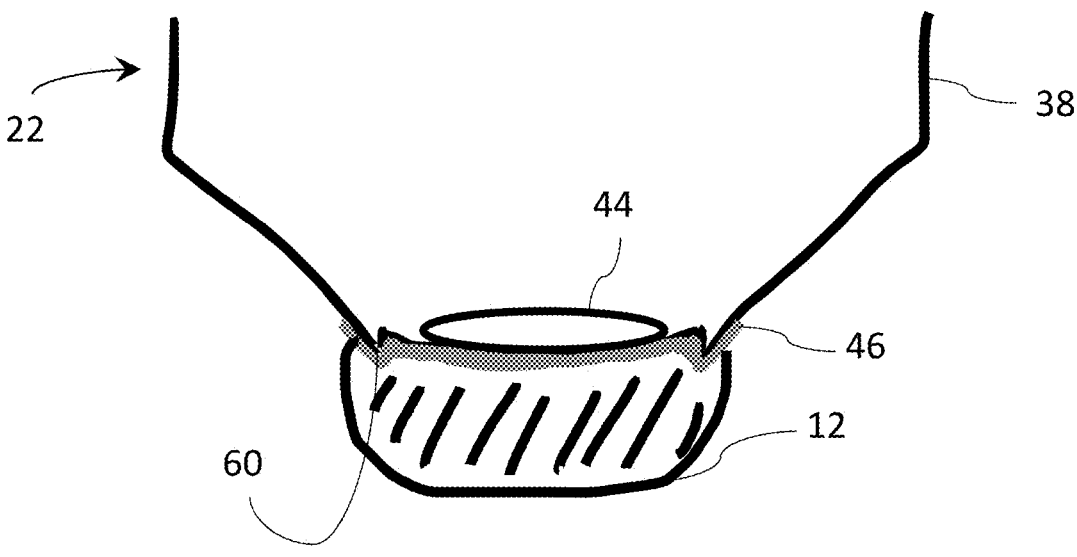
Figure 8:
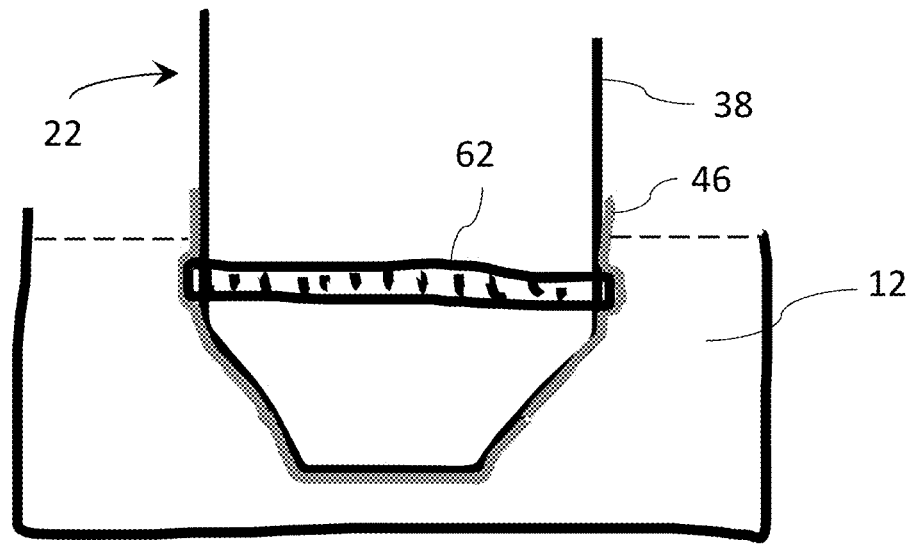

Further advantages and aspects of the invention emerge from the claims and from the following description of preferred exemplary embodiments of the invention, which are explained below with reference to the figures. Identical and functionally corresponding elements are provided with identical reference signs. In the figures:

FIG. 1 shows a schematic representation of a laser lithography device for producing a three-dimensional structure in a lithographic material, FIG. 2 shows a sketched representation of a lens of the laser lithography device of FIG. 1 with a protection device, the lens being immersed in the lithographic material, FIG. 3 shows a sketched representation of the lens of FIG. 2 with a further protection device, FIG. 4 shows a sketched representation of the lens of FIG. 3 with an additional protection device, FIG. 5 shows a further sketched representation of the lens of FIG. 2, FIG. 6 shows a sketched representation of the lens of FIG. 5 during removal of the protection device, FIG. 7 shows a sketched representation of a variant of the lens of FIG. 2, and FIG. 8 shows a sketched representation of a further variant of the lens of FIG. 2 and a variant of the protection device from FIG. 1 to 7.

FIG. 1 shows a schematic representation of a laser lithography device 10 for producing a three-dimensional structure in a lithographic material 12. The lithographic material 12 is a liquid photosensitive substance that is accommodated in a container 14 and has a lithographic material surface 16.

The laser lithography device 10 has a laser source 18 for emitting a laser writing beam 20 and a lens 22 for focusing the laser writing beam 20 in a focus region 24. In this case, the three-dimensional structure is produced by local solidification, in particular local polymerization, of the lithographic material 12 as a result of multi-photon absorption within the focus region 24. In the present example, the three-dimensional structure is to be produced on a substrate 26 which is arranged within the container 14 and is surrounded by the lithographic material 12. Depending on the application, however, embodiments without a substrate and/ or without containers can also be advantageous.

The laser lithography device 10 has a scanning device 28 for displacing the focus region 24 of the laser writing beam 20 relative to the lithographic material 12. For this purpose, the scanning device 28 has a beam guiding and steering assembly 30 and actuators 32 in the form of (here by way of example three) servomotors.

The beam guiding and steering assembly 30 is arranged within an optical path of the laser writing beam 20. The beam guiding and steering assembly 30 deflects the laser writing beam 20. The beam guiding and steering assembly 30 comprises a beam shaping module which forms the laser writing beam 20, for example, on the basis of geometric description data of the three-dimensional structure to be produced.

The actuators 32 are arranged on a container holder 34 of the laser lithography device 10 for the purpose of displacing the container holder 34 in three mutually orthogonal spatial directions x, y, z. Each of the three servomotors of the actuators 32 causes a displacement in one of the spatial directions x, y, z. For example, a displacement of the container holder 34 takes place on the basis of geometric description data of the three-dimensional structure to be produced.

The lens 22 is mounted on a head plate 36 of the laser lithography device 10. The head plate 36 can be displaceable by means of further actuators of the scanning device 28.

The lens 22 has a lens housing 38 which is mounted on the head plate 36 such that an entry aperture 40 of the lens 22 corresponds to a corresponding opening 42 of the head plate 36. The laser writing beam 20 propagates along the optical path through the opening 42 and through the entry aperture 40.

The lens 22 has an optical terminating element 44 in the form of a terminating lens. The optical terminating element 44 is held by the lens housing 38. In this respect, the terminating element 44 forms the transition from the lens 22.

The laser lithography device 10 has a protection device 46 for preventing contact between the optical terminating element 44 and the lithographic material 12. The protection device 46 is arranged directly on the optical terminating element 44 so that the protection device 46 has a touching contact with the optical terminating element 44. The protection device 46 completely covers the optical terminating element 44. The protection device 46 partially covers the lens housing 38.

The laser writing beam 20 exits the lens 22 through the optical terminating element 44 and propagates through the protection device 46 to then form the focus region 24. A transmittance of the protection device 44 for the laser writing beam 20 is preferably at least 90%.

For producing the three-dimensional structure, the lens 22 is immersed in the lithographic material 12. In other words, the optical terminating element 44 is located below the lithographic material surface 16. In an immersed state of the lens 22, the protection device 46 prevents contact between the optical terminating element 44 and the lithographic material 12. Therefore, the protection device 46 allows the lens 22 to be immersed into the lithographic material 12 without the optical terminating element 44 being impaired by the lithographic material 12 (e. g., soiled or damaged).

In the shown embodiment in FIG. 1, the protection device 46 is a sticker in the form of an adhesive tape. The protection device 46 preferably consists only of the adhesive tape which comprises an adhesive layer and a film. The adhesive layer is a first layer with a first refractive index. The film is a second layer with a second refractive index. The first refractive index can differ from the second refractive index, but this is not mandatory. The effective refractive index of the protection device 46 is a combination of the first refractive index and the second refractive index.

The film is fastened, in particular glued, to the optical terminating element 44 by means of the adhesive layer. Overall, the protection device 46 has a thickness 48 of 60 μm.

FIG. 2 shows a sketched representation of the lens 22, wherein the lens 22 is immersed in the lithographic material 12. For example, the lithographic material 12 is highly absorbent for the laser writing beam 20. The laser writing beam 20 propagates within the lithographic material 12 along a propagation path 50 which extends from the protection device 46 to the focus region 24. During propagation along the propagation path 50, the laser writing beam 20 is absorbed by the lithographic material 12. Due to the protection device 46 having the thickness 48 of 60 μm, the propagation path 50 within the lithographic material 12 has reduced by 60 μm. Due to the reduced propagation path 50, more power of the laser writing beam 20 passes into the focus region 24.

FIG. 3 shows a sketched representation of the lens 22 of FIG. 2 with a further protection device 52. The further protection device 52 is arranged on the protection device 46. The further protection device 52 covers the protection device 46. In the example, the further protection device 52 is designed to be equal to the protection device 46, which is why reference is made to the description of the protection device 46 with regard to the features of the further protection device 52. By means of the protection device 46 and the further protection device 52, the propagation path 50 of the laser writing beam 20 within the lithographic material 12 is reduced overall by 120 μm. Due to the reduced propagation path 50, more power of the laser writing beam 20 enters the focus region 24.

FIG. 4 shows a sketched representation of the lens 22 of FIG. 3 with an additional (third) protection device 54. The additional protection device 54 is arranged on the further (second) protection device 52. The additional protection device 54 covers the further protection device 52. The additional protection device 54 is designed, for example, the same as the (first) protection device 46, which is why reference is made to the description of the protection device 46 with regard to the features of the additional protection device 54. By means of the protection device 46, the further protection device 52 and the additional protection device 54, the propagation path 50 of the laser writing beam 20 within the lithographic material 12 is reduced by 180 μm overall. Due to the reduced propagation path 50, more power of the laser writing beam 20 enters the focus region 24.

By arranging a plurality of protection devices 46, 52, 54, the propagation path 50 of the laser writing beam 20 within the lithographic material 12 is reduced such that sufficient power of the laser writing beam 20 enters the focus region 24 to induce polymerization of the lithographic material 12. As a result, lithographic materials that highly absorb the laser writing beam 20 can be used to produce the three-dimensional structure.

The refractive index of the respective protection devices 46, 52, 54 differs, for example, from a refractive index of the lithographic material 12. An embodiment is conceivable, in which the refractive index of the lithographic material 12 cannot be corrected by the lens 22, which is why imaging errors occur in the form of chromatic aberration and/or spherical aberration when the laser writing beam 20 propagates within the lithographic material 12. The refractive index of the respective protection devices 46, 52, 54 is corrected by the lens 22. As a result, the imaging errors are additionally reduced by arranging a plurality of protection devices 46, 52, 54.

FIG. 5 shows another sketched representation of the lens 22. Impurities 56 in the form of bacteria and viruses adhere to the optical terminating element 44. The protection device 46 is sterile and is arranged on the optical terminating element 44 such that the impurities 56 are not introduced into the lithographic material 12, even if the lens 22 is immersed in the lithographic material 12. A contamination of the lithographic material 12 is thereby prevented.

FIG. 6 shows a sketched representation of the lens 22 of FIG. 2 during the removal of the protection device 46. The lens 22 was used to produce a three-dimensional structure and was immersed in the lithographic material 12. During production, lithographic material 12 has deposited on the protection device 46. To remove the lithographic material 12, only the protection device 46 in the form of the adhesive tape is removed from the lens 22 in a pull-off direction 58. The adhesive layer enables a residue-free removal of the protection device 46 from the optical terminating element 44.

FIGS. 7 and 8 show variants of the lens of FIG. 1 to 6, and FIG. 8 additionally shows a variant of the protection device of FIG. 1 to 7, wherein the same reference signs are used for identical and functionally equivalent elements, and reference can be made in this respect to the above explanations of the exemplary embodiments of FIG. 1 to 6 or the exemplary embodiments of FIG. 1 to 7, so that basically, only the existing differences are discussed.

FIG. 7 shows a sketched representation of a variant 22 of the lens of FIG. 2. The optical terminating element 44 is held deeper within the lens housing 38 compared to the variant of FIG. 1 to 6. The lens housing 38 has a projection 60. The protection device 46 can be shaped such that the protection device 46 is arranged on the optical terminating element 44 without a cavity, for example an air chamber, between the optical terminating element 44 and the protection device 46. In particular, the protection device 46 can be shaped such that the protection device 46 rests against the projection 60 without forming a cavity.

FIG. 8 shows a sketched representation of a further variant 22 of the lens of FIG. 2 and a variant 46 of the protection device from FIG. 1 to 7.

The protection device 46 consists only of a film in the form of an adhesive film. The adhesive film is a homogeneous sheet of very thin plastic with a thickness of 14 µm. In contrast to the exemplary embodiment of FIG. 1 to 7, the protection device 46 of FIG. 8 does not have an adhesive layer. The adhesive film is fastened to the optical terminating element 44 by means of adhesion.

The lens housing 38 has, for example, an element 62 which is unsuitable for contact with the lithographic material. In the sketched example, the element 62 is an operating element in the form of a circumferential correction collar. When the element 62 is actuated, imaging errors, for example, chromatic aberration and/or spherical aberration, can be corrected.

If the lithographic material 12 gets onto the element 62, the lithographic material 12 can get into the lens housing 38 and damage or contaminate the lens 22. Cleaning or repairing the lens 22 would be complicated.

To prevent contact between the lithographic material 12 and the element 62, the protection device 46 completely covers the element 62. The lens 22 can thereby dip particularly deep into the lithographic material 12. In particular, the lens 22 can dip so deep into the lithographic material 12 that the element 62 is located below the lithographic material surface 16.

In an alternative embodiment, the protection device 46 can be an adhesive tape which completely covers the element 62.

The invention claimed is:

1. A laser lithography device for producing a three-dimensional structure in a lithographic material, the laser lithography device comprising:
   a laser source for emitting a laser writing beam;
   a lens for focusing the laser writing beam in a focus region, wherein the lens has an optical terminating element;
   a scanning device for displacing the focus region of the laser writing beam relative to the lithographic material; and
   a protection device for preventing contact between the optical terminating element and the lithographic material, wherein
   the protection device is arranged directly on the optical terminating element,
   the protection device has an adhesive layer for fastening the protection device to the optical terminating element, and
   the protection device is a sticker or an adhesive tape.

2. The laser lithography device according to claim 1, wherein the protection device has a film or a foil.

3. The laser lithography device according to claim 1, wherein the protection device is designed to be fastened to the optical terminating element.

4. The laser lithography device according to claim 1, wherein a transmittance of the protection device for the laser writing beam is at least 80%.

5. The laser lithography device according to claim 1, wherein
   the lens has a lens housing,
   the optical terminating element is received by the lens housing,
   the lens housing has an element that is unsuitable for contact with the lithographic material, and
   the protection device covers the element to prevent contact between the element and the lithographic material.

6. The laser lithography device according to claim 1, wherein
   the protection device has a refractive index that can be corrected by the lens.

7. The laser lithography device according to claim 1, wherein
   the protection device has a first layer having a first refractive index and a second layer having a second refractive index, and
   the first refractive index differs from the second refractive index.

8. The laser lithography device according to claim 1, further comprising a second protection device for preventing contact between the optical terminating element and the lithographic material, wherein the second protection device is arranged on the protection device.

9. A method for producing the three-dimensional structure in the lithographic material by means of the laser lithography device according to claim 1.

10. The laser lithography device according to claim 1, wherein a transmittance of the protection device for the laser writing beam is at least 85%.

11. The laser lithography device according to claim 1, wherein a transmittance of the protection device for the laser writing beam is at least 90%.

12. The laser lithography device according to claim 1, wherein a transmittance of the protection device for the laser writing beam is at least 92%.

13. The laser lithography device according to claim 1, wherein a transmittance of the protection device for the laser writing beam is at least 95%.

14. A method for producing a three-dimensional structure in a lithographic material, the method comprising:

emitting a laser writing beam;

focusing the laser writing beam in a focus region;

displacing the focus region of the laser writing beam relative to the lithographic material; and preventing contact between an optical terminating element and the lithographic material by using a protection device, wherein the protection device is a sticker or an adhesive tape.

*     *     *     *     *